Aug. 11, 1964 D. S. COCHRAN 3,144,619
OSCILLATION GENERATOR HAVING AN AMPLITUDE STABILIZING CIRCUIT
Filed July 14, 1961
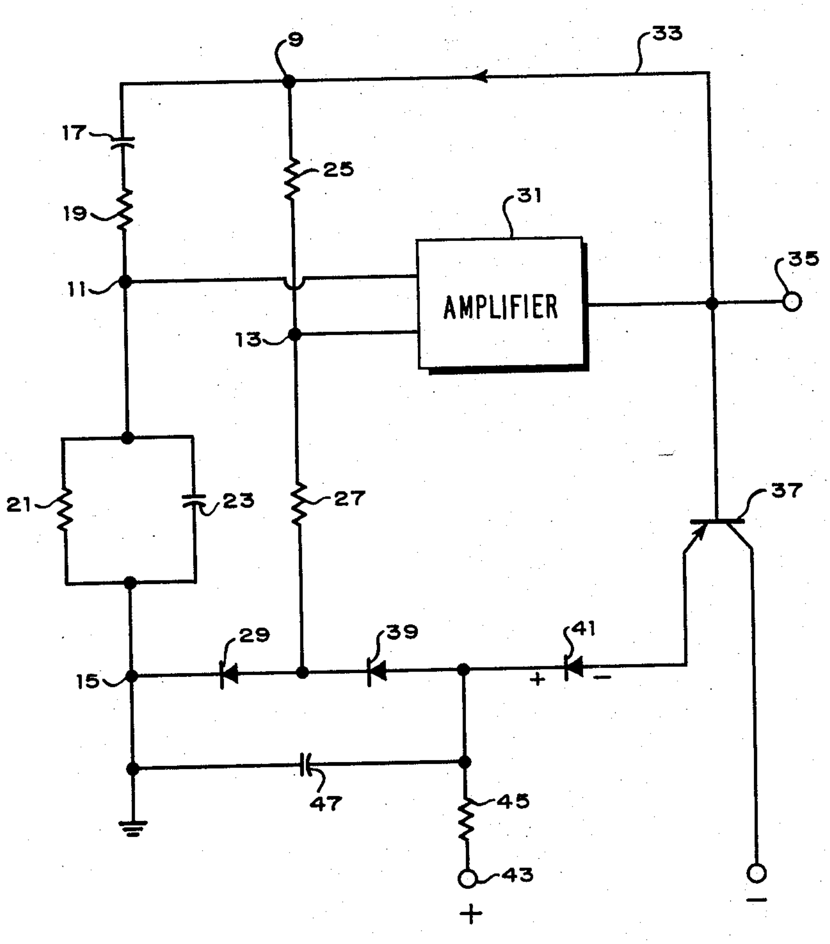
INVENTOR
DAVID S. COCHRAN
BY J. I. Chognard
ATTORNEY United States Patent Office 3,144,619

Patented Aug. 11, 1964

3,144,619
OSCILLATION GENERATOR HAVING AN AMPLITUDE STABILIZING CIRCUIT

David S. Cochran, Palo Alto, Calif., assignor to Hewlett-Packard Company, Palo Alto, Calif., a corporation of California Filed July 14, 1961, Ser. No. 124,104
6 Claims. (Cl. 331—109)

This invention relates to a circuit that stabilizes the amplitude of an oscillatory signal which is produced by a transistor oscillator circuit.

Amplitude stabilization of oscillatory signals is readily achieved in certain oscillator circuits by using a variable gain electron tube. These tubes show amplification characteristics that are dependent upon the signal voltage applied to the gain controlling electrode. Thus, amplitude stabilization of the oscillatory signal produced by an electron tube oscillator circuit having a variable gain electron tube may be readily achieved by applying to the gain controlling electrode of such a tube a voltage that is related to the amplitude of the oscillatory signal. However, when solid state elements such as transistors are used in an oscillator circuit, this method of achieving amplitude stabilization cannot be used conveniently. One known method of achieving amplitude stabilization in solid state oscillator circuits is to use of a heat-sensitive element such as a thermistor connected in the resistive arms of the oscillator bridge circuit. The resistance of this element increases as the amplitude of the feedback signal and hence, as the power applied to it increases. The amplitude of the oscillations is thus decreased as the attenuation ratio of the resistive arms decreases. One disadvantage of this method is that changes in ambient temperature also affect the resistance of the element and thus the amplitude stabilization is dependent upon operating temperature.

Accordingly, it is an object of the present invention to provide an amplitude stabilizing circuit for a transistor oscillator.

It is another object of the present invention to provide an amplitude stabilizing circuit for a transistor oscillator which maintains the amplitudes of oscillations at a substantially constant level independent of changes in ambient temperatures.

In accordance with a preferred embodiment of the present invention a bridge-type oscillator circuit having frequency-selective bridge arms and resistive bridge arms is provided with a variable resistor in one of the resistance arms, which variable resistance is made responsive to the amplitude of the oscillatory signal. The variable resistance is a forward biased diode connected in a circuit which decreases the forward bias current through the diode as the amplitude of oscillation increases.

Other and incidental objects of the present invention will be apparent from a reading of this specification and an inspection of the accompanying drawing which shows a schematic diagram of a circuit in accordance with a preferred embodiment of the invention.

Referring now to the drawing, there is shown a bridge circuit having nodes 9, 11, 13, and ground node 15. Capacitor 17 and resistor 19 are serially connected between nodes 9 and 11 and comprise one of the frequency-selective bridge arms. The parallel combination of resistor 21 and capacitor 23 connected between node 11 and ground node 15 comprises the other frequency-selective bridge arm. The resistive arms of the bridge include resistor 25 between nodes 9 and 13 and resistor 27 and diode 29 serially connected between node 13 and ground node 15. A high gain amplifier 31 is connected to amplify the difference in the voltages appearing at nodes 11 and 13 and to provide an output signal that is related to the difference voltage. The output signal of amplifier 31 is returned to node 9 through line 33, is applied to output terminal 35 and is applied to the base electrode of transistor 37. The emitter electrode of transistor 37 is connected to the ground node 15 through serially connected diodes 29 and 39 and Zener diode 41. Forward bias current for diodes 29 and 39 flows from power supply terminal 43 through resistor 45. A large bypass capacitor 47 is connected in shunt with the serially connected diodes 29 and 39.

The frequency at which the oscillator circuit operates is determined by the values of resistance and capacitance used in the frequency-selective arms connected between nodes 9 and 11 and between nodes 11 and 15. At the proper frequency of oscillation, the relative phase angle between the voltages appearing at nodes 11 and 13 is substantially zero. The amplitude of the difference in voltages appearing between the two nodes may be determined by the ratio of the resistors in the resistance arms connected between nodes 9 and 13 and between nodes 13 and 15. Thus, the amplitude of the difference voltage between nodes 11 and 13 and, hence, the amplitude of the output signal appearing at node 35 may be varied by varying the attenuation ratio provided by the resistance arms. This variation of the attenuation ratio does not affect the relative phase angle of the voltages appearing between the nodes 11 and 13 and hence does not affect the frequency of oscillations.

In the preferred embodiment of the present invention, the forward biased diode 29, serially connected in the lower resistance arm, and forward biased diode 39 are used as the variable resistance elements. As the signal applied to the base electrode of transistor 37 increases in amplitude, the signal on the emitter electrode of the transistor also increases. The Zener diode 41 is connected to be reverse biased under normal operating conditions. Transistor 37 operates substantially as a normally non-conductive switch. Thus, when the signal appearing at the emitter electrode of transistor 37 increases to a sufficiently negative value to cause diode 41 to operate in the Zener region, transistor 37 is able to conduct current through Zener diode 41. The current which previously flowed in diodes 29 and 39 then flows in the emitter-collector junction of transistor 37. This causes diodes 29 and 39 to conduct less current and to increase forward conduction resistance. The increased diode resistance thus serves to change the resistance ratio of the oscillator bridge arms and thereby to reduce the amplitude of oscillations appearing at the output terminal 35. The forward bias current in diodes 29 and 39 is reduced when the peak amplitude of the negative half-cycles of the output signal exceeds the breakdown voltage of Zener diode 41. This causes the attenuation ratio of the resistance arms of the oscillator circuit to vary and thereby to regulate the amplitude of the output signal to a value that is determined substantially by the breakdown voltage of Zener diode 41. The large shunt capacitor 47 serves to maintain the stabilizing conditions relatively unchanged during the remainder of the cycle of the output signal. Capacitor 47 also serves to connect diodes 29 and 39 in shunt for signal frequencies. Thus the change in resistance for signal of one polarity through diode 29 is substantially the same as the change in resistance for signal of the other polarity through diode 39.

The stabilization circuit of the present invention provides amplitude stablization of the oscillatory wave-form independent of changes in the ambient temperature. In addition, amplitude stabilization is only provided when the output amplitude exceeds a predetermined value. By obtaining stabilization of the output signal amplitude in this manner, the regulation is made responsive only to the amplitude of the output signal. Further, if the frequency-selective arms of the oscillator bridge circuit are adapted to provide variable frequency operation, the amplitude stability achieved by the present invention remains unaffected by changes in the signal division ratio of the frequency-selective arms which changes are commonly produced by errors in the tracking of simultaneously adjustable elements.

I claim:

1. In an electronic oscillator the combination comprising a frequency selective signal attenuator, a resistive signal attenuator, an amplifier connected to receive the outputs of the frequency-selective and resistive attenuators and adapted to produce an output signal that is related to the difference between the signals at the outputs of said attenuators, a feedback path to apply the output signal to the frequency-selective and resistive attenuators, a first forward biased diode connected in series with the resistive signal attenuators, a second forward biased diode, alternating current conducting means so connecting the first and second diodes in parallel that successive half cycles of the alternating polarity applied signal appear in the forward conduction direction alternately across each of the diodes, said diodes being connected to vary the attenuation ratio of the resistive signal attenuator in response to changes in the current in said diodes, means providing forward bias current in the first and second diodes, a source of reference potential, a switch held non-conductive by said reference potential and being connected to apply the output signal to said diodes, said switch becoming conductive to vary the forward bias current in said diodes when the amplitude of the output signal exceeds the value of said reference potential.

2. In an electronic oscillator the combination comprising a frequency selective signal attenuator, a resistive signal attenuator, an amplifier connected to receive the outputs of the frequency-selective and resistive attenuators and adapted to produce an output signal that is related to the difference between the signals at the outputs of said attenuators, a feedback path to apply the output signal to the frequency-selective and resistive attenuators, a first forward biased diode connected in series with the resistive signal attenuators, a second forward biased diode, alternating current conducting means so connecting the first and second diodes in parallel that successive half cycles of an alternating polarity applied signal appear in the forward conduction direction alternately across each of the diodes, said diodes being connected to decrease the attenuation ratio of the resistive signal attenuator in response to a decrease in the current in said diodes, means providing forward bias current in the first and second diodes, the total forward bias current for said diodes being substantially equal to the forward bias current in one of the first and second diodes, a source of reference potential, a switch rendered non-conductive by said reference potential and being connected to apply the output signal to said diodes, said switch becoming conductive to decrease the forward bias current in said diodes when the amplitude of the output signal exceeds the value of said reference potential.

3. In a transistor oscillator the combination comprising a frequency selective signal attenuator, a resistive signal attenuator, an amplifier connected to receive the signals at the outputs of the frequency-selective and resistive attenuators and adapted to produce an output signal that is related to the difference between the signals at the outputs of said attenuators, a feedback path to apply the output signal to the frequency-selective and resistive attenuators, a first forward biased diode connected in series with the resistive signal attenuators, a second forward biased diode, a capacitor connecting the first and second diodes in parallel, said diodes being connected to increase forward conductivity alternately on half cycles of an applied alternating current signal, said diodes being connected to decrease the attenuation ratio of the resistive signal attenuator in response to a decrease in the current in said diodes, means providing forward bias current in the first and second diodes, the total forward bias current in said diodes being substantially equal to the forward bias current in one of the first and second diodes, a third diode having a preselected, reverse breakdown voltage, a normally non-conductive transistor switch including the third diode, said switch being connected to receive the output signal and being adapted to conduct through the third diode a portion of the forward bias current in said diodes when the amplitude of the output signal exceeds said reverse breakdown voltage.

4. In a transistor oscillator having a pair of frequency-selective circuits and a pair of resistive circuits connected to form the arms of an oscillator bridge circuit, and having an amplifier with its input connected to one diagonal of the bridge circuit and its output connected to another diagonal of the bridge circuit; an amplitude stabilizer comprising a first diode connected in series with one of the resistive circuit arms, a second diode, signal conducting means connecting the first and second diodes in parallel, said diodes being connected to increase forward conductivity alternately on half cycles of an applied alternating current signal, a source of forward bias current for said diodes, the first and second diodes being connected to vary the attenuation ratio of the resistive circuit arms in response to the current in said diodes, a third diode having a predetermined reverse breakdown voltage, a transistor having input and output circuits and having the input circuit connected to receive the output of said oscillator, means including the third diode and connecting the first and second diodes to the output circuit of said transistor, said transistor becoming conductive to conduct through said third diode a portion of the forward bias current in the first and second diodes when the amplitude of the output of said oscillator exceeds said reverse breakdown voltage.

5. In a transistor oscillator having a pair of serially connected frequency-selective circuits and a pair of serially connected resistive circuits connected to form an oscillator bridge circuit and having an amplifier with its input connected to the common terminals of the pairs of frequency-selective and resistive circuits and having its output connected to apply the signal appearing thereon to said pairs of circuits; an amplitude stabilizer comprising a first diode connected in series with one of said pair of resistive circuits, a second diode, signal conducting means connecting the first and second diodes in parallel, a source of forward bias current for said diodes, said diodes being connected to vary the attenuation ratio of said pair of resistive circuits in response to the current in said diodes, a transistor having emitter and collector electrodes forming a current conducting path and having a base electrode connected to the output of said amplifier for controlling current in said current conducting path in response to signal applied to said base electrode, a source of reference potential, means including said source so connecting said diodes to the current conducting path of said transistor as to render said transistor cut off; said transistor becoming conductive to decrease the current in said diodes when the amplitude of signal at the output of said amplifier exceeds the value of the reference potential.

6. In an electronic valve oscillator having a pair of serially connected frequency-selective circuits and a pair of serially connected resistive circuits connected to form an oscillator bridge circuit and having an amplifier with its input connected to the common terminals of the pairs of frequency-selective and resistive circuits and having its output connected to apply the signal appearing thereon to said pairs of circuits; an amplitude stabilizer comprising a first diode connected in series with one of said pair of resistive circuits, a second diode, signal conducting means connecting the first and second diodes in parallel, a source of forward bias current for said diodes, said diodes being connected to vary the attenuation ratio of said pair of resistive circuits in response to the current in said diodes, an electronic valve having first and second electrodes forming a current conducting path and having a control electrode connected to the output of said amplifier for controlling current in said current conducting path in response to signal applied to said control electrode, a source of reference potential, means including said source so connecting said diodes to the current conducting path of said electronic valve as to render said electronic valve cut off; said electronic valve becoming conductive to decrease the current in said diodes when the amplitude of signal at the output of said amplifier exceeds the value of the reference potential.

References Cited in the file of this patent

UNITED STATES PATENTS

| | | |
|---|---|---|
| 2,346,396 | Rider | Apr. 11, 1944 |
| 2,704,330 | Marker | Mar. 15, 1955 |
| 3,031,627 | Reichert et al. | Apr. 24, 1962 |
| 3,114,116 | Reeds | Dec. 10, 1963 |
| 3,127,577 | Lapointe | Mar. 31, 1964 |

FOREIGN PATENTS

| | | |
|---|---|---|
| 644,083 | Great Britain | Oct. 4, 1950 |